US007687890B2

(12) United States Patent
Subramanian et al.

(10) Patent No.: US 7,687,890 B2
(45) Date of Patent: *Mar. 30, 2010

(54) CONTROLLING SUBSTRATE SURFACE PROPERTIES VIA COLLOIDAL COATINGS

(75) Inventors: Gopalakrishnan Subramanian, Chandler, AZ (US); Nirupama Chakrapani, Chandler, AZ (US); Larry DeCesare, Chandler, AZ (US); Shripad Gokhale, Chandler, AZ (US); Jason Murphy, Chandler, AZ (US); Jinlin Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 104 days.

This patent is subject to a terminal disclaimer.

(21) Appl. No.: 11/729,644

(22) Filed: Mar. 29, 2007

(65) Prior Publication Data

US 2008/0237810 A1  Oct. 2, 2008

(51) Int. Cl.
    H01L 23/00 (2006.01)
    H01L 21/00 (2006.01)
(52) U.S. Cl. .............................. 257/629; 257/E21.503; 257/795; 438/127; 438/758; 427/133
(58) Field of Classification Search ................ 257/629, 257/739, E21.001, E23.191, 795, E21.501, 257/E21.502, E21.503, E23.136; 438/106, 438/127, 758; 427/133
See application file for complete search history.

(56) References Cited

U.S. PATENT DOCUMENTS

| 6,048,656 | A  | * | 4/2000  | Akram et al. ................ 438/118 |
| 6,372,839 | B1 | * | 4/2002  | Ito et al. ...................... 524/493 |
| 6,937,315 | B2 | * | 8/2005  | Lee et al. ..................... 349/153 |
| 2003/0226498 | A1 | * | 12/2003 | Alivisatos et al. ............. 117/84 |
| 2005/0064201 | A1 | * | 3/2005  | Noro ........................... 428/414 |
| 2005/0136552 | A1 | * | 6/2005  | Buechler ..................... 436/514 |
| 2007/0244268 | A1 | * | 10/2007 | Usui et al. ................... 525/524 |

OTHER PUBLICATIONS

Quere, David "Non-sticking drops", Institute of Physics Publishing, Rep. Prog. Phys. 68, Sep. 7, 2005, pp. 2495-2532.
Bico, J. et al., "Pearl Drops", Europhys. Lett., 47(2), Jul. 15, 1999, pp. 220-226.
Quere, David "Rough Ideas on wetting", Physica A 313, 2002, pp. 32-46.
Klein, Rob J., et al., "Producing Super-Hydrophobic Surfaces with Nano-Silica Spheres", Materials Department, University of California, 2003, 1-12 pages.
Lafuma, Aurelie et al., "Superhydrophobic States", nature materials, vol. 2, Jun. 22, 2003, pp. 457-460.

* cited by examiner

*Primary Examiner*—Victor A Mandala
*Assistant Examiner*—Scott Stowe
(74) *Attorney, Agent, or Firm*—Caven & Aghevli LLC

(57) ABSTRACT

Methods and apparatus to control surface properties via colloidal coatings are described. In one embodiment, colloidal coating may be used on a surface to enhance flow control. Other embodiments are also described.

20 Claims, 4 Drawing Sheets

CONTROLLING SUBSTRATE SURFACE PROPERTIES VIA COLLOIDAL COATINGS

BACKGROUND

The present disclosure generally relates to the field of electronics. More particularly, an embodiment of the invention relates to controlling substrate surface properties.

Underfilling in some semiconductor packages may be provided by capillary flow. In order to achieve high throughput time, the underfill may be made such that it has a relatively low viscosity and good wetability to substrate solder resist. Moreover, underfill may be dispensed at elevated temperatures, for example, close to 110 degrees C., to enhance underfill flow. This approach may leave a tongue of underfill at the dispense side. This tongue may increase the footprint of the package which may limit the provision of ultra small form factor (USFF) semiconductor packages. Additionally, in stacked die packages, the die-attach bleed-out onto wire bond pads may be a critical issue that may impact the ability to develop small form factor stacked die packages.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Some embodiments of the invention (such as those discussed with reference to FIGS. 1-8) relate to microelectronic components that may include a colloidal coating, e.g., to enable small form factor, multi-chip, and/or stacked die packages by controlling the flow and/or location of polymer formulations. More specifically, an embodiment of the invention relates to the use of a colloidal coating with dual surface roughness features that may render a substrate surface highly non-wetting for controlling the location of dispensable materials and/or for controlling the wetting or bleed-out of polymer materials during assembly.

Figure 1:
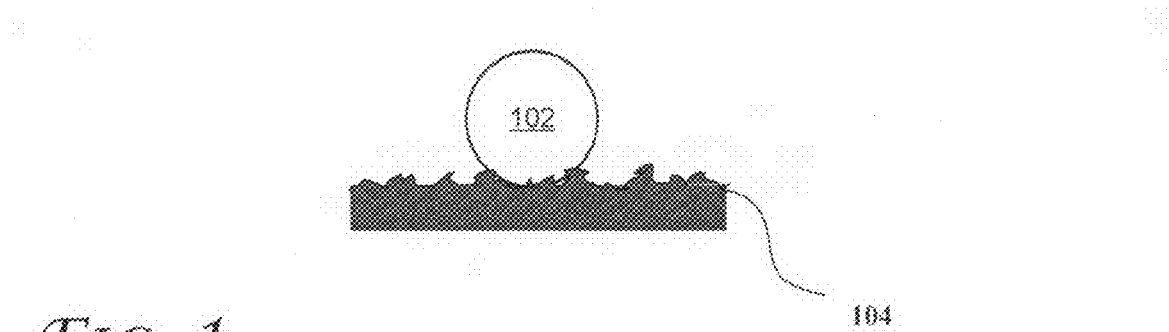
FIG. 1 illustrates the behavior of droplets on a hydrophobic surface, according to an embodiment of the invention.

FIG. 1 illustrates the behavior of droplets on a hydrophobic surface, according to an embodiment of the invention. As shown in FIG. 1, a droplet 102 (which may be polymer material droplet in an embodiment) may follow features or asperities of a surface 104. Generally, a hydrophilic surface becomes more hydrophilic and a hydrophobic surface becomes more hydrophobic with increasing roughness. The roughness may have a significant impact on the wetting properties of surfaces. This behavior may be theoretically explained by Wenzel and Casey-Baxter models. Moreover, the poly-dispersity of the particles may increase the surface roughness (e.g., due to different length scales of the particles) and thus enhances the surface hydrophobicity. For a weakly hydrophobic particle surface (e.g., with a contact angle θ only slightly greater than 90 degrees), the apparent contact angle, θ* on the rough surface may vary linearly with the roughness according to Wenzel's law:

$$\cos \theta^* = R \cos \theta$$

In the above equation, R is the roughness of the surface. In this regime, the droplet follows the asperities of the surface as shown in FIG. 1. If the particles' surface is more hydrophobic (e.g., contact angle θ much greater than 90 degrees), then the wetting property may be dictated by Casey-Baxter law which leads to super-hydrophobic behavior due to trapping of air pockets as follows:

$$\cos \theta^* = f_s \cos \theta_{S/L} + f_{air} \cos \theta_{L/Air}$$

In the above equation, $f_s$ and $f_{air}$ are the area fractions of solid and air respectively ($f_s + f_{air} = 1$) and $\theta_{S/L}$ and $\theta_{L/Air}$ are the contact angles of the solid/liquid and liquid/air interfaces, respectively. Since the contact angle for any liquid in air may be 180 degrees and the Casey-Baxter equation simplifies to:

$$\cos \theta^* = f_s \cos \theta_{S/L} + f_s - 1$$

As may be seen, the apparent contact angle may approach 180 degrees (corresponding to $\cos \theta^* = -1$) for low values of $f_s$ and hence render the surface super-hydrophobic. Thus, by modifying the surface roughness, the hydrophobicity of the surface may be significantly amplified. Further, by employing poly-disperse colloidal coatings or by in-situ generation of poly-disperse particles with the sol-gel process, the roughness of the coating may be increased significantly. In general, the sol-gel process may involve the transition of a system from a liquid "sol" (mostly colloidal) into a solid "gel" phase. Further, by proper functionalization of the particles to make them hydrophobic or hydrophilic, the wetting property of the coating may be greatly enhanced. In an embodiment, the sol-gel process may consist of: (a) particle formation, (b) growth of particles, and (c) linking of particles to form an extended network. pH, temperature, catalyst (acid or base), reagent concentrations (alkoxide, alcohol, water, acid/base etc), reaction time etc. may be some of the main factors that may be tuned to obtain particles of desired size and functionality. Further, in some embodiments, acid-catalyzed hydrolysis in sol-gel silica synthesis may yield branched polymers, whereas base-catalyzed hydrolysis in sol-gel silica synthesis may yield highly branched clusters.

Figure 2:
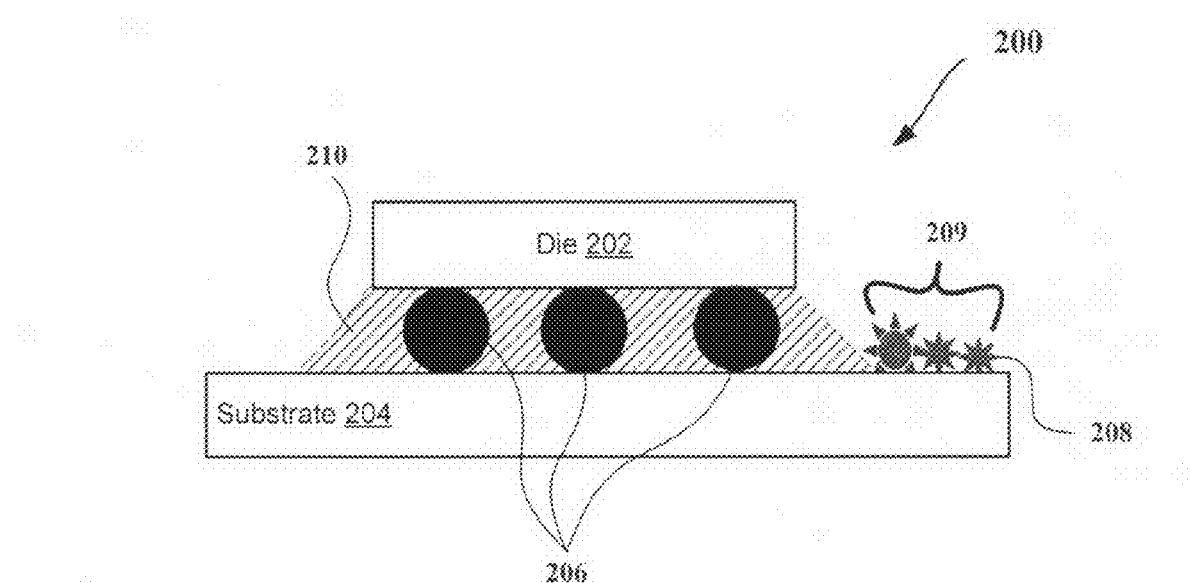
FIG. 2 illustrates a side view of a semiconductor package that utilizes a colloidal coating, in accordance with an embodiment of the invention.

FIG. 2 illustrates a side view of a semiconductor package 200 that utilizes a colloidal coating, in accordance with an embodiment of the invention. In one embodiment, a package 200 may include a die 202 that is coupled to a substrate 204, e.g., via one or more solder balls 206. As shown in FIG. 1, the colloidal coating 208 may be used to improve the flow of underfill 210 and wetting. In an embodiment, the coating 208 may be provided in a keep-out zone (KOZ) 209 to improve the behavior of the underfill 210 in the KOZ, which is further discussed herein, e.g., with reference to FIGS. 5-6. Furthermore, the poly-dispersity of the colloidal coating 208 may enhance surface roughness and may be used to amplify the non-wetting behavior in the KOZ while improving underfill flow underneath the die 202 by suitable surface treatment, for example making them hydrophobic and hydrophilic by silane treatments.

Figure 3:
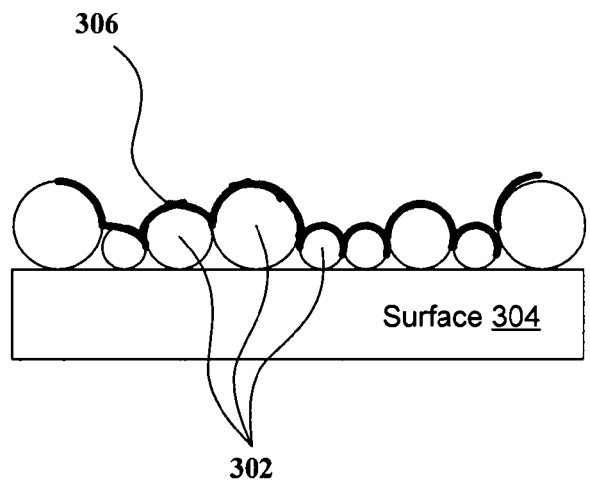
FIG. 3 illustrates the behavior of colloidal particles on a surface, according to one embodiment of the invention.

FIG. 3 illustrates the behavior of colloidal particles on a surface, according to one embodiment of the invention. Colloidal particles 302 on a surface 304 may define a topography change on the surface 304. In an embodiment, the poly-dispersity of the particles 302 may enhance surface roughness as shown by the thicker line 306 that follows the top surface of the particles 302.

Figure 4:
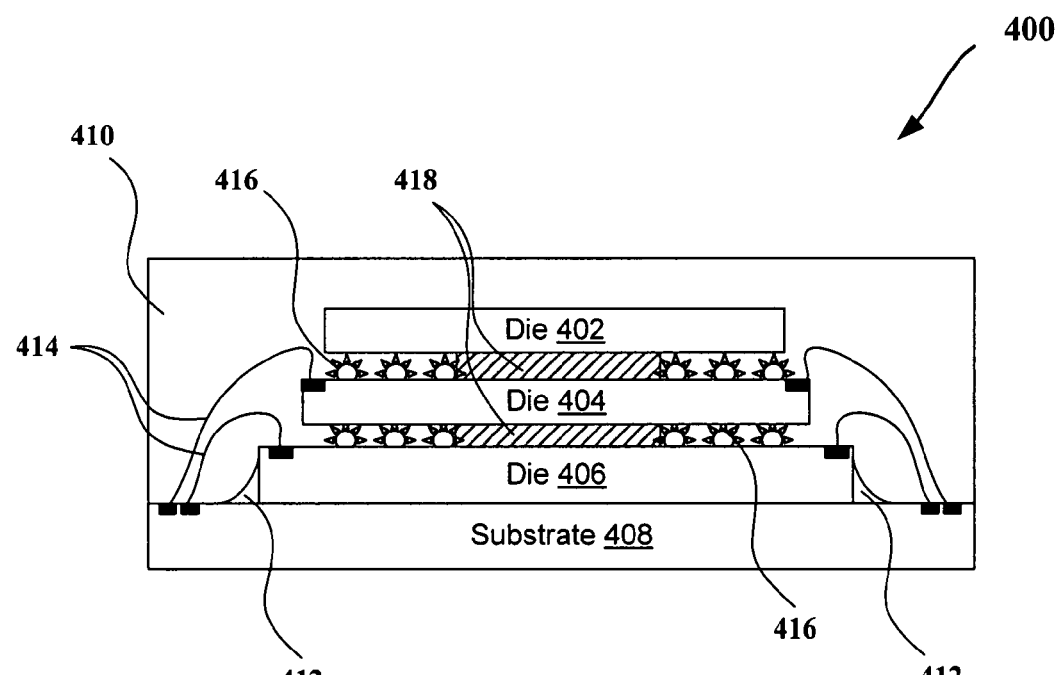
FIG. 4 illustrates a cross sectional view of a stacked semiconductor package, according to an embodiment of the invention.

FIG. 4 illustrates a cross sectional view of a stacked semiconductor package 400, according to an embodiment of the invention. In one embodiment, colloidal coatings may be used to enable provision of the stacked semiconductor package 400. The package 400 may include one or more dies 402, 404, and/or 406 that are stacked on a package substrate 408. The package 400 may have a mold 410, e.g., to mechanically couple various components of the package 400. In one embodiment, underfill 412 may be provided between the substrate 408 and the bottom die 406.

As shown in FIG. 4, one or more wire bonds 414 may electrically couple pads on dies 402-406 and/or substrate 408. Also, colloidal coatings 416 may be provided between one or more of the dies 402-406. As shown in FIG. 4, die attach adhesive layers 418 may couple the dies 402-406. In the embodiment shown in FIG. 4, the coatings 416 may be used to reduce and/or prevent bleed-out of the die attach adhesive layers 418. Accordingly, in various embodiments, the colloidal coatings discussed herein may be used to reduce and/or prevent bleed-out of various material such as underfill, adhesive, etc.

Figure 5:
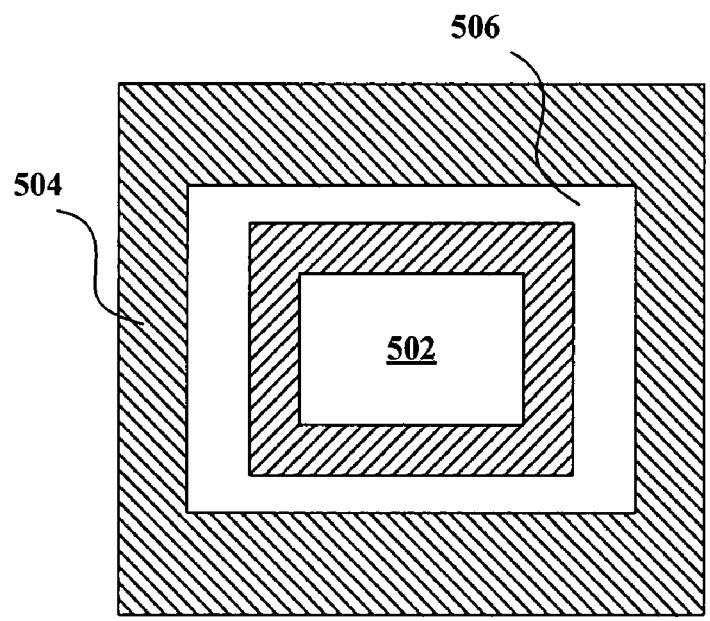
FIGS. 5 and 6 illustrate top views of semiconductor devices, according to some embodiments of the invention.
Figure 6:
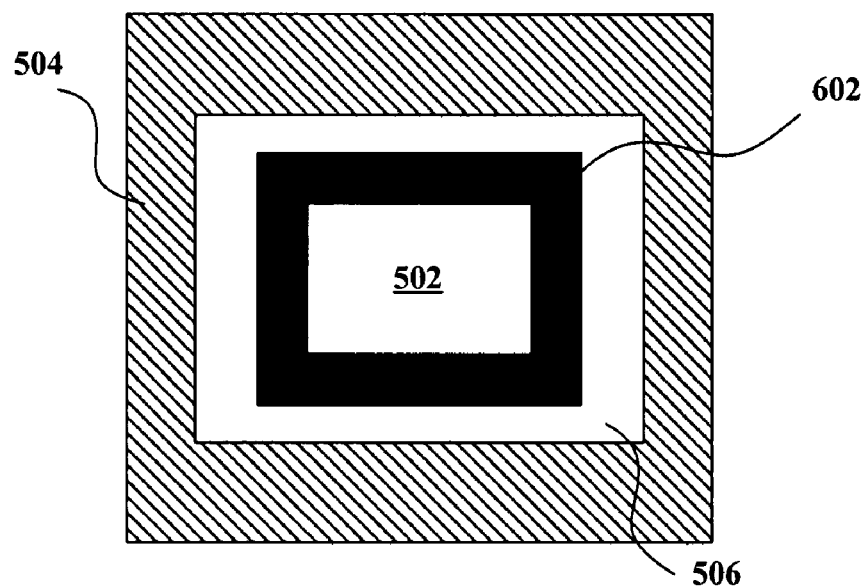

FIGS. 5 and 6 illustrate top views of semiconductor devices, according to some embodiments of the invention. In one embodiment, FIGS. 5 and 6 illustrate how colloidal coating may be used to control the keep-out zone (KOZ). In particular, a die 502 may be coupled to a substrate 504. A colloidal coating 506 may be provided in the perimeter of the die 502 as a non-wetting barrier to underfill 602. Moreover, FIG. 5 illustrates the semiconductor device after application of the coating 506 and FIG. 6 illustrates the semiconductor device after application of the underfill 602. Even though FIGS. 5 and 6 illustrate that the colloidal coating 506 may be provided in the perimeter of the die 502, the coating 506 may be provided in various other shapes and/or locations (such as Proximate to one or more of the sides of the die 502, for example).

Figure 7:
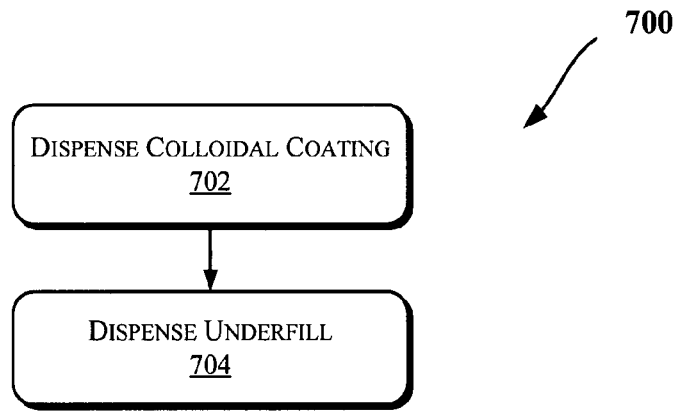
FIGS. 7 and 8 illustrate block diagrams of methods according to some embodiments of the invention.
Figure 8:
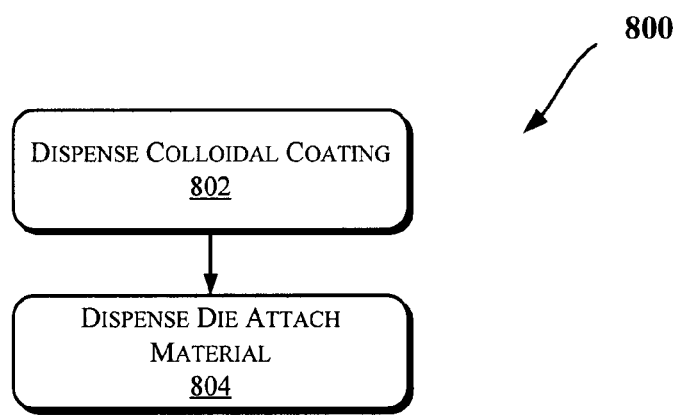

FIGS. 7 and 8 illustrate block diagrams of embodiments of methods 700 and 800, respectively, to provide colloidal coating on surfaces of a semiconductor device. In an embodiment, various components discussed with reference to FIGS. 1-6 may be utilized to perform one or more of the operations discussed with reference to FIGS. 7 and 8.

Referring to FIGS. 1-7, at an operation 702, colloidal coating may be dispensed on a surface (e.g., colloidal coating 506 may be dispensed on the substrate 504). At an operation of 704, underfill may be dispensed within the boundaries defined by the dispensed colloidal coating (e.g., underfill 602 may be dispensed within the boundaries defined by colloidal coating 506).

Referring to FIGS. 1-6 and 8, at an operation 802, colloidal coating may be dispensed on a surface (e.g., colloidal coating 416 may be dispensed on one or more of the dies 404 and/or 406). At an operation of 804, die attach material may be dispensed within the boundaries defined by the dispensed colloidal coating (e.g., die attach material 418 may be dispensed within the boundaries defined by colloidal coating 416).

Even though one or more of the embodiments discussed herein describe utilization of a colloidal coating with reference to controlling underfills and die attach adhesive, some of the embodiments may be applicable wherever flow control is desired in electronic packages. Some examples of applications for the non-wetting coatings include controlling the keep-out zone of underfills, keep-out zone of fluxes, bleed-out of die attach adhesives, flashing by mold compounds, etc. Also, the coatings discussed herein may be applied to substrates, microelectronic packages, and/or dies.

As discussed with reference to FIGS. 1-8, in some embodiments, roughness may enhance the hydrophilicity or hydrophobicity of a surface. By choosing suitably functionalized poly-disperse colloidal coatings, the hydrophobicity of a surface may be significantly increased. The poly-disperse colloidal dispersions may either be derived from commercially available colloids or the sol-gel process may be used to generate these particles in-situ. Even if the colloidal particles are only weakly non-wetting, the roughness induced by the poly-dispersity of the particles results in the coating itself to be highly non-wetting and may ensure effective KOZ control for underfill or die-attach bleed-out. Further, when the colloidal particles are partially wetting (e.g., their contact angle is less than 90), the surface roughness offered by the particles may decrease the wetting angle. Apart from contributing to improved wetting, the colloidal coating may lead to enhanced flow due to the additional capillary force offered by the enhanced wetting. Such coatings may be used to decrease the flow time of underfill and molding compounds.

In an embodiment, the coatings discussed herein may be applied by imprinting, spray coating, dispensing a fine line using a needle dispenser, combinations thereof, etc. Also, the shape of the colloidal particles discussed herein with reference to various embodiments may include but are not limited to spheres, tetrapods, rods, tubes, platelets, etc. Additionally, the colloidal coatings may be made from organic or inorganic materials including but not limited to polystyrene, polymethyl methacrylate, silica, alumina, titania, zirconia, carbon, etc.

In an embodiment, a colloidal coating that has a range of particle sizes (from nanometers to microns) may be used to impart a high degree of bimodal roughness on the surface and make the surface highly non-wetting. The colloidal coatings may include hierarchical roughness in some embodiments. In one embodiment, the colloidal coating may be provided through an inorganic or organic poly-disperse colloidal suspensions. In another embodiment, the colloidal coating may be provided by employing sol-gel synthesis for in-situ generation of poly-disperse colloidal particles on the substrate.

In some embodiments, the use of colloidal coatings with a poly-disperse size distribution of particles in the range of nanometers to microns may provide a much larger roughness scale and renders the surface significantly more non-wetting. Also, this may reduce and/or eliminate the need for methods such as plasma treatment to induce macroscopic roughness (as done at some substrate suppliers to increase underfill-solder resist adhesion). Further, by increasing roughness, significant hydrophobicity may be imparted even to weakly non-wetting surfaces. Also, by controllably varying the particle sizes in the colloidal coating, the roughness and hence the wetting properties of the surface may be tuned. The colloidal particles may include but not limited to inorganic (silica, alumina, zirconia, or titania) or organic (carbon, polystyrene, or poly methyl methacrylate) that are modified to make their surface hydrophobic. Carbon nano-tube solution/suspension may also be employed. The in-situ sol-gel process may naturally produce colloidal particles and flocs of different length scales. The sol-gel process may be tuned to functionalize particles (such as with silanes) to achieve the desired level of hydrophobicity/hydrophilicity. Moreover, since only a liquid may be dispensed in the in-situ sol gel process, it may overcome the beading issue that may be seen with some current coating methods that results in non-uniform particle distribution along the length of the coating. Also, the alcohol medium may improve the wetting of the reaction mixture onto the substrate and results in uniform coating widths.

In various embodiments of the invention, the operations discussed herein, e.g., with reference to FIGS. 1-8, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device to store the computer program.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection). Accordingly, herein, a carrier wave shall be regarded as comprising a machine-readable medium.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
    a colloidal coating provided on a surface to introduce surface roughness in at least a portion of the surface, wherein the colloidal coating is to control a flow of a material within the portion of the surface and wherein one or more particles of the colloidal coating have a one or more of a tube shape or a platelets shape.

2. The apparatus of claim 1, wherein the portion of the surface comprises one or more of a keep-out zone of underfills or a keep-out zone of fluxes.

3. The apparatus of claim 1, wherein the surface comprises one or more of a surface of a semiconductor substrate, a semiconductor die, or a semiconductor package.

4. The apparatus of claim 1, wherein the material comprises one or more of a die attach adhesive or a mold compound flashing.

5. The apparatus of claim 1, wherein the colloidal coating has a particle size range from nanometers to microns.

6. The apparatus of claim 1, wherein particles of the coating are generated by a sol-gel process.

7. The apparatus of claim 1, further comprising a dispenser to provide the coating by one or more of imprinting, spray coating, dispensing a fine line using a needle dispenser, or combinations thereof.

8. The apparatus of claim 1, wherein one or more particles of the colloidal coating have a one or more of a tetrapod shape or a rod shape.

9. The apparatus of claim 1, wherein the colloidal coating comprises one or more of an organic or an inorganic material.

10. The apparatus of claim 9, wherein the organic material is to comprise polystyrene.

11. The apparatus of claim 9, wherein the inorganic material comprises one or more of zirconia or titania.

12. The apparatus of claim 1, wherein the coating is to enhance the flow of the material within the portion of the surface, at least in part, through additional capillary force offered by the coating.

13. A method comprising:
    dispensing a colloidal coating on a surface to introduce surface roughness in at least a portion of the surface,
    wherein the colloidal coating is to control a flow of a material within the portion of the surface and wherein one or more particles of the colloidal coating have a one or more of a tube shape or a platelets shape.

14. The method of claim 13, wherein dispensing the coating comprises dispensing one or more of an organic material or an inorganic material.

15. The method of claim 13, further comprising generating one or more particles of the coating through a sol-gel process.

16. The apparatus of claim 4, wherein the material is to further comprise an underfill.

17. The apparatus of claim 8, wherein one or more particles of the colloidal coating are to further have a spherical shape.

18. The apparatus of claim 10, wherein the organic material is to further comprise poly methyl methacrylate.

19. The apparatus of claim 11, wherein the inorganic material is to further comprise one or more of silica or alumina.

20. The method of claim 13, wherein one or more particles of the colloidal coating have a one or more of a tetrapod shape or a rod shape.

* * * * *